United States Patent [19]

Richardson et al.

[11] 3,992,653

[45] Nov. 16, 1976

[54] ZERO INSERTION FORCE CARD GUIDE

[75] Inventors: Paul H. Richardson, Bloomington; William S. Theros, Eagan, both of Minn.

[73] Assignee: Sperry Rand Corporation, New York, N.Y.

[22] Filed: Aug. 18, 1975

[21] Appl. No.: 605,359

[52] U.S. Cl.................................. 317/100; 165/80; 317/101 DH; 339/75 MP
[51] Int. Cl.² ......................................... H05K 7/20
[58] Field of Search.................. 165/80; 174/16 HS; 317/100, 101 DH; 339/17 L, 17 LC, 17 LM, 17 M, 112 R, 75 MP

[56] References Cited
UNITED STATES PATENTS

| | | | |
|---|---|---|---|
| 2,857,577 | 10/1958 | Vanderpool | 339/75 MP |
| 3,211,822 | 10/1965 | Krall | 174/16 HS |
| 3,495,132 | 2/1970 | Anhalt | 317/101 DH |
| 3,631,325 | 12/1971 | Wenz | 317/100 |

*Primary Examiner*—Gerald P Tolin
*Attorney, Agent, or Firm*—Thomas J. Nikolai; Kenneth T. Grace; Marshall M. Truex

[57] ABSTRACT

An electronic module which provides for the insertion of printed circuit cards into the card receptacles of a heat exchanger with essentially zero insertion force. The printed circuit cards are of the type wherein individual electrical components are mounted on printed wiring boards with the body of the components in physical contact with thermally conductive strip members also located on the printed circuit board. These strip members terminate at the edge of the board at which is located an edge strip, also formed from a thermally conductive material. The edge strip is arranged to cooperate with a surface of a heat exchanger. A plurality of springs are provided for normally urging the edge strip against this surface. When it is desired to insert or remove a printed circuit card, the springs are compressed in unison so as to allow free ingress and egress to the card receptacle.

7 Claims, 1 Drawing Figure

U.S. Patent
Nov. 16, 1976
3,992,653
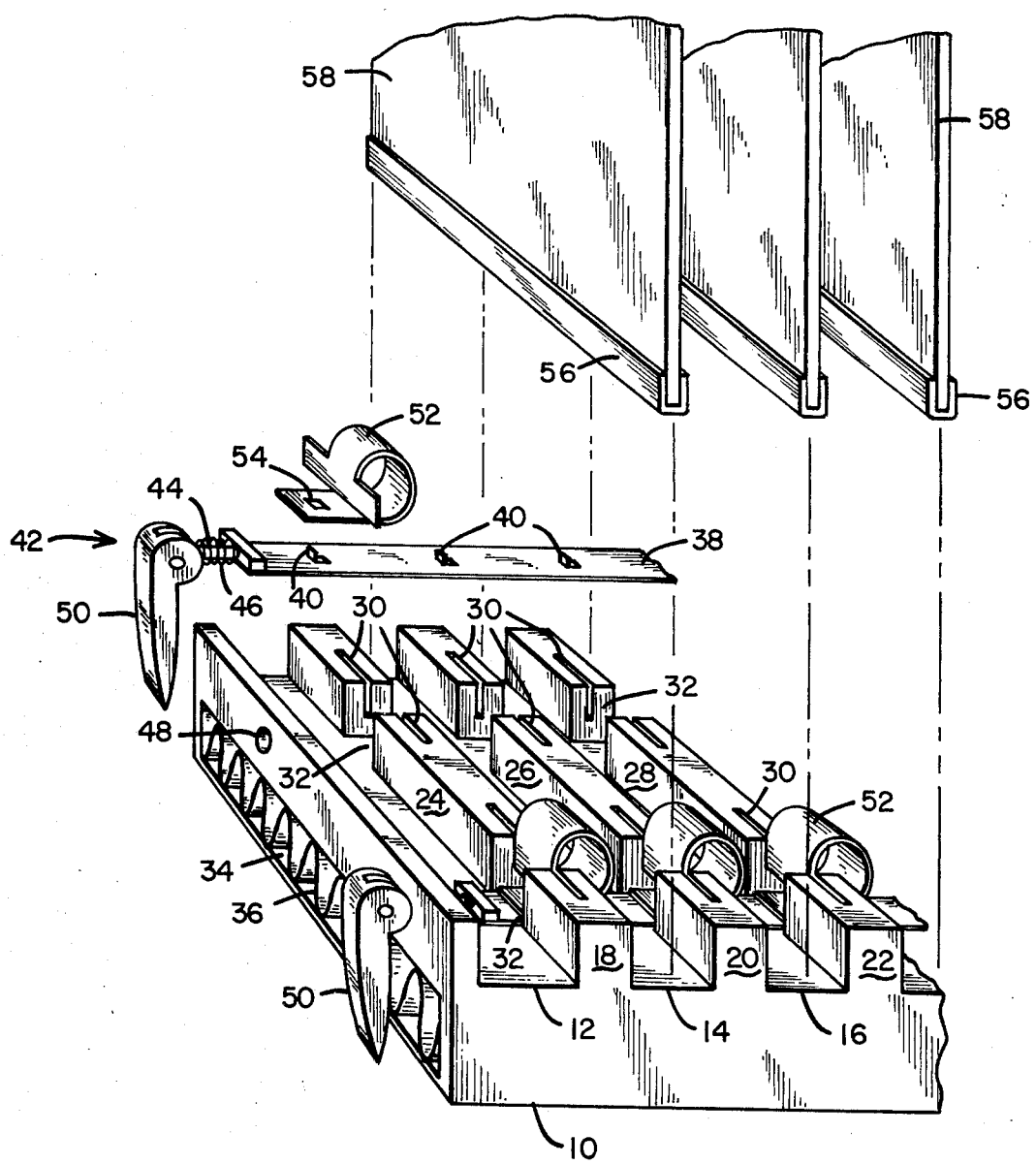

ZERO INSERTION FORCE CARD GUIDE

BACKGROUND OF THE INVENTION

In U.S. Pat. No. 3,631,325 issued to Charles F. Wenz and assigned to the assignee of the present application, which Patent is hereby incorporated by reference there is described a module in which the heat exchanger comprises a block of thermally conductive material in which is formed parallel notches into which may be inserted the edges of a printed circuit board. Located in each of the parallel notches is a series of leaf springs which bear against the printed circuit card and hold the edge strip in intimate contact with the walls of the notches formed in the heat exchanger. The Wenz patent attempts to overcome the insertion and withdrawal force problem by coating the edge strips with a suitable material having good thermal conductivity and a low coefficient of friction.

The present invention is considered to be an improvement over the invention described in the aforementioned Wenz patent. Rather than providing leaf springs as in the Wenz patent, the arrangement of the present invention includes a means whereby the spring tension which normally urges the edges of the printed circuit boards in contact with the surface of the heat exchanger may be removed so that the printed circuit board can be inserted into or removed from the heat exchanger with very little force or pressure.

In accordance with the teachings of the present invention, there is provided a heat exchanger in the form of a block of thermally conductive material in which a plurality of parallel notches are formed and which are adapted to receive the edges of a plurality of printed circuit cards having thermally conductive edge strips thereon. A plurality of helical springs are provided which have one end thereof secured to the vertical segments of the block located between adjacent notches and the other end secured to a movable release strip. The release strip, in turn, is connected to a lever and cam arrangement such that when the lever is moved to a first position, the spring members secured thereto are compressed to the point where they no longer occlude the notches in the heat exchanger block adapted to receive the printed circuit card edges. When the cam lever is moved to the opposite position, the spring tension is released and these helical springs force the edge strip of the card into intimate contact with the sidewalls of the notches in the heat exchanger block.

The present invention permits many printed circuit boards, which may already be plugged electrically into a backpanel, to be simultaneously inserted into the grooves of a heat exchanger which may be disposed on the side of the printed circuit boards opposite from the backpanel.

OBJECTS

Accordingly, it is the object of the present invention to provide an improved electronic module.

Another object of the present invention is to provide an electronic module into which printed circuit boards may be inserted and removed with little or no insertion or removal force required.

Still another object of the present invention is to provide an electronic module in which the heat exchanger has a plurality of notches for accepting the edges of a plurality of printed circuit boards in unison and in which spring tension can be selectively applied or removed.

These and other objects of the invention will become apparent from the following specification when considered in light of the accompanying drawing which shows diagrammatically by means of an exploded view the preferred embodiment of this invention.

DESCRIPTION OF PREFERRED EMBODIMENT

Referring now to FIG. 1, there is shown a block 10 of thermally conductive material such as aluminum having a plurality of parallel, spaced apart notches 12, 14 and 16. Between adjacent notches are rectangular projections 18, 20 and 22 defining side-wall surfaces 24, 26 and 28. Formed in the top surface of the rectangular projections 18, 20 and 22 are a plurality of slits 30. Also formed in the rectangular projections 18, 20 and 22 are slots 32 of substantially the same depth as the notches 12, 14 and 16 but which are oriented transverse to the longitudinal direction of these notches.

The heat exchanger block 10 is also provided with a chamber 34 located below the bottom surfaces of the notches 12, 14 and 16. The chamber 34 passes all the way through the block 10 and may include metallic fins 36. Air or some other suitable heat exchanging fluid can be made to flow through the chamber 34 to remove heat which is conducted from the components on the printed circuit card and through the sidewalls 24, 26 and 28 to the fins 36.

As is illustrated in the exploded view, first and second spring release strips 38 are provided which are adapted to fit into the slots 32 and extend across the width of the heat exchanger block 10. The spring release strips 38 may be formed from beryllium copper or other suitable material and have a plurality of projections 40 extending vertically from the upper surface thereof. The spacing between adjacent projections 40 corresponds approximately to the spacing between adjacent rectangular projections 18, 20 and 22 formed in the heat exchanger block 10. Secured to one end of the spring release strip 38 is a cam mechanism indicated generally by numeral 42. The cam mechanism includes a cylindrical link 44 about which is positioned a return spring 46. The pin 44 is adapted to pass through a hole 48 formed in the end wall of the heat exchanger block 10. Pivotally secured to the link 44 is a cam handle 50.

Also provided are a plurality of spring members 52, there being one for each of the slits 30 formed in the heat exchanger projections 18, 20 and 22. As is shown in the drawing, spring 52 is of the helical type, but if laid flat, would resemble the letter "T". The horizontally extending portion of the "T" is dimensioned so as to fit snugly within the slits 30. The other end of the "T" has an aperture 54 formed therein and when the T-shaped spring is bent in a helical fashion as illustrated, the apertures 54 fit over the projections 40 formed in the release strip 38.

In operation, and with the assembly oriented in the position shown, the cam lever handles 50 are rotated clockwise and because of the manner in which the spring release strip projections 40 cooperate with the apertures 54 in the spring member 52, rotation in a clockwise direction increases the tension on the spring members 52, thereby compressing the spring and allowing the edge strips 56 on the printed circuit cards 58 to be inserted into the right-most end of the notches 12, 14 and 16 and slid to the left until the printed circuit boards are positioned in the heat exchanger block 10 in the desired fashion. Because the spring members 52 do not occlude the notches 12, 14, etc., it is also possible, and in some applications desirable, to insert the edges of a plurality of printed circuit boards simultaneously into the notches from the top rather than from the side. This is especially true where the printed circuit boards are already electrically connected to a so called "mother board" by connectors located on the edges of the cards opposite from the edges having the strips 56 thereon.

Following this step, the handles 50 are rotated counter-clockwise and the return spring 46 along with the spring forces exerted by the springs 52 move the spring release strip 38 to the right, allowing the springs 52 to expand against the side of the printed circuit boards 58 and forcing the thermally conductive edge strip 56 into intimate contact with the sidewalls 24, 26 and 28 of the notches 12, 14 and 16. This insures good thermal conductivity from the edge strips 56 to the heat exchanger block 10, allowing the heat to be removed by the cooling fluid passing through the chamber 34.

Thus, it can be seen that the present invention provides an electrical module in which printed circuit cards may be inserted and removed from a heat exchanger with a minimum of force and friction between the card and the heat exchanger. Once inserted, the cards are securely held in place by the operation of the helical springs 52.

Although the invention has been illustrated and described in detail, it is to be clearly understood that the same is by way of illustration and example only and is not to be taken by way of limitation, the spirit and scope of the invention being limited only by the terms of the appended claims.

What is claimed is:

1. In a electronic module in which electrical components are mounted on printed circuit cards in contact with thermally conductive strips on said cards, said strips being connected to a thermally conductive edge strip, an improved heat exchanger comprising:
   a. a block of thermally conductive material having a plurality of spaced apart parallel notches formed on one surface thereof adapted to loosely receive the edge strips of said printed circuit cards and a plurality of parallel slits formed between said notches;
   b. a plurality of arcuate spring members having a tab at one end inserted in said slits and an aperture at the other end;
   c. a cam actuatable member movably mounted on said block having a plurality of projections extending therefrom at spaced intervals such that said projections pass through said apertures in said spring members, the arrangement being such that when said cam actuatable member is in a first position, said spring members urge the edge strips of said cards against the sidewalls of said notches and when said cam actuatable strip is in a second position said cards fit loosely in said notches.

2. Apparatus as in claim 1 wherein said block further includes a chamber extending beneath said notches through which a cooling fluid may pass.

3. Apparatus as in claim 2 wherein said cam actuatable member abuts the bottom of said notches and extends transverse to the side walls of said notches.

4. Apparatus as in claim 1 wherein said spring members are generally T-shaped, the horizontal portion of said T forming tabs which are inserted in said slits and the vertical portion of said T being bent out of the plane of said horizontal portion such that said aperture lies in a plane transverse to the plane of said horizontal portion.

5. In a electronic module in which heat dissipating electrical components are mounted on printed circuit boards in thermal contact with thermally conductive strips leading to thermally conductive edge strips on said printed circuit boards, an improved heat exchanger comprising:
   a. a block of thermally conductive material having plural rows of parallel rectangular notches defining vertical sidewalls and a vertically extending slit in the vertically extending portion of said block between adjacent sidewalls and parallel thereto and a slot in said vertically extending portion of said block transverse to said notches;
   b. a plurality of arcuate spring members having a tab at one end inserted in said slits and an aperture in the other end;
   c. a strip having a plurality of projections extending from one surface thereof, said strip slidably mounted in said slot with said projections extending through said apertures in said spring members; and
   d. a lever operated cam member connected to said strip for sliding said strip relative to said block when said lever is manually operated, the arrangement being such that when said lever operated cam member is in a first position said spring members urge the edge strips of said cards against the sidewalls of said notches and when said strip is in a second position said cards fit loosely in said notches.

6. Apparatus as in claim 5 wherein said block further includes a heat transfer chamber located adjacent to the plane defined by the bottom of said slots through which a heat transfer fluid may flow.

7. Apparatus as in claim 5 wherein the width of said notches is greater than the thickness of said printed circuit board and said edge strip.

* * * * *